(12) United States Patent
Tang et al.

(10) Patent No.: US 12,106,976 B2
(45) Date of Patent: Oct. 1, 2024

(54) STEAM-ASSISTED SINGLE SUBSTRATE CLEANING PROCESS AND APPARATUS

(71) Applicant: Applied Materials, Inc., Santa Clara, CA (US)

(72) Inventors: Jianshe Tang, San Jose, CA (US); Wei Lu, Fremont, CA (US); Haosheng Wu, Santa Clara, CA (US); Taketo Sekine, Santa Clara, CA (US); Shou-Sung Chang, Mountain View, CA (US); Hari N. Soundararajan, Sunnyvale, CA (US); Chad Pollard, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 18/213,717

(22) Filed: Jun. 23, 2023

(65) Prior Publication Data
US 2023/0335418 A1    Oct. 19, 2023

Related U.S. Application Data

(62) Division of application No. 17/141,622, filed on Jan. 5, 2021, now Pat. No. 11,728,185.

(51) Int. Cl.
*H01L 21/67* (2006.01)
*B08B 3/02* (2006.01)
(Continued)

(52) U.S. Cl.
CPC ........ *H01L 21/67051* (2013.01); *B08B 3/024* (2013.01); *B08B 3/08* (2013.01);
(Continued)

(58) Field of Classification Search
CPC ......... H01L 21/02074; H01L 21/67051; H01L 21/67109; H01L 21/02057;
(Continued)

(56) References Cited

U.S. PATENT DOCUMENTS 5,882,433 A    3/1999    Ueno
5,964,952 A   10/1999    Kunze-Concewitz
(Continued)

FOREIGN PATENT DOCUMENTS

JP    H10507683 A    7/1998
JP    2007180117 A    7/2007
(Continued)

OTHER PUBLICATIONS

International Search Report issued to PCT/US2021/062652 on Apr. 7, 2022.
(Continued)

*Primary Examiner* — Benjamin L Osterhout
(74) *Attorney, Agent, or Firm* — Patterson + Sheridan, LLP

(57) ABSTRACT

The present disclosure relates to a method and apparatus for cleaning a substrate. The method includes rotating a substrate disposed on a substrate support and spraying a front side of the substrate using steam through a front side nozzle assembly. A back side of the substrate is sprayed using steam through a back side dispenser assembly. A heated chemical is dispensed over the front side of the substrate.

19 Claims, 3 Drawing Sheets

(51) Int. Cl.
   *B08B 3/08*      (2006.01)
   *B08B 3/12*      (2006.01)
   *B08B 5/02*      (2006.01)
   *H01L 21/02*     (2006.01)
   *H01L 21/306*    (2006.01)

(52) U.S. Cl.
   CPC .......... *B08B 3/12* (2013.01); *B08B 5/02* (2013.01); *H01L 21/02057* (2013.01); *H01L 21/30625* (2013.01); *B08B 2203/007* (2013.01); *B08B 2230/01* (2013.01); *H01L 21/02074* (2013.01); *H01L 21/67109* (2013.01)

(58) Field of Classification Search
   CPC ....... H01L 21/30625; B08B 5/02; B08B 3/08; B08B 3/12; B08B 3/024; B08B 2230/01; B08B 2203/007
   See application file for complete search history.

(56) References Cited

U.S. PATENT DOCUMENTS

| | | | |
|---|---|---|---|
| 6,460,552 | B1 | 10/2002 | Lorimer |
| 6,491,764 | B2 | 12/2002 | Mertens et al. |
| 6,610,168 | B1 | 8/2003 | Miki et al. |
| 6,770,151 | B1 | 8/2004 | Ravkin et al. |
| 6,834,440 | B2 | 12/2004 | Lee |
| 6,890,391 | B2 | 5/2005 | Aoki et al. |
| 6,946,399 | B1 | 9/2005 | Lorimer |
| 6,954,993 | B1 | 10/2005 | Smith et al. |
| 7,000,623 | B2 | 2/2006 | Welsh et al. |
| 7,644,512 | B1 | 1/2010 | Liu et al. |
| 7,927,429 | B2 | 4/2011 | Nanba et al. |
| 7,947,637 | B2 | 5/2011 | Kneer |
| 8,056,253 | B2 | 11/2011 | Liu et al. |
| 8,113,221 | B2 | 2/2012 | Nanba et al. |
| 8,276,291 | B2 | 10/2012 | Liu et al. |
| 8,739,429 | B2 | 6/2014 | Liu et al. |
| 8,795,032 | B2 | 8/2014 | Miyazaki et al. |
| 8,857,449 | B2 | 10/2014 | Miya |
| 9,142,399 | B2 | 9/2015 | Shibashi |
| 9,165,799 | B2 | 10/2015 | Wang et al. |
| 10,518,382 | B2 | 12/2019 | Kweon et al. |
| 11,728,185 | B2 * | 8/2023 | Tang ............... H01L 21/02057 438/692 |
| 2002/0007844 | A1 | 1/2002 | Orii et al. |
| 2002/0020436 | A1 | 2/2002 | Bergman |
| 2002/0066475 | A1 | 6/2002 | Verhaverbeke et al. |
| 2003/0192570 | A1 | 10/2003 | Thakur et al. |
| 2003/0192577 | A1 | 10/2003 | Thakur et al. |
| 2004/0040177 | A1 | 3/2004 | Izumi |
| 2004/0045589 | A1 | 3/2004 | Holsteyns et al. |
| 2004/0103915 | A1 | 6/2004 | Verhaverbeke et al. |
| 2004/0144862 | A1 | 7/2004 | Boyd et al. |
| 2005/0178504 | A1 | 8/2005 | Speh et al. |
| 2006/0016458 | A1 | 1/2006 | Novak et al. |
| 2007/0049009 | A1 | 3/2007 | Hsu et al. |
| 2007/0220775 | A1 | 9/2007 | Miya |
| 2007/0246081 | A1 | 10/2007 | Lu et al. |
| 2008/0050679 | A1 | 2/2008 | Salek et al. |
| 2008/0292877 | A1 | 11/2008 | Horie et al. |
| 2008/0295868 | A1 | 12/2008 | Nakamura et al. |
| 2009/0101181 | A1 | 4/2009 | Morisawa et al. |
| 2010/0325913 | A1 | 12/2010 | Wang et al. |
| 2012/0048295 | A1 | 3/2012 | Du et al. |
| 2013/0167947 | A1 | 7/2013 | Nakano et al. |
| 2014/0051259 | A1 | 2/2014 | Shibayama |
| 2014/0083468 | A1 | 3/2014 | Miyazaki et al. |
| 2014/0283884 | A1 | 9/2014 | Liu et al. |
| 2014/0302676 | A1 | 10/2014 | Miyazaki et al. |
| 2015/0050863 | A1 | 2/2015 | Miyazaki et al. |
| 2015/0052776 | A1 | 2/2015 | de Jong |
| 2015/0111804 | A1 | 4/2015 | Dory et al. |
| 2015/0159124 | A1 | 6/2015 | Takahashi et al. |
| 2015/0159125 | A1 | 6/2015 | Kneer |
| 2015/0267112 | A1 | 9/2015 | Dory et al. |

FOREIGN PATENT DOCUMENTS

| | | |
|---|---|---|
| JP | 2016 189001 A | 11/2016 |
| KR | 1020050026175 A | 6/2004 |
| KR | 101061921 B1 | 9/2011 |
| KR | 1020180135173 A | 12/2018 |
| WO | 2006001117 | 1/2006 |
| WO | 2007084952 A2 | 7/2007 |
| WO | 2008005354 A2 | 1/2008 |
| WO | 2010104816 A1 | 9/2010 |
| WO | 2013133401 A1 | 9/2013 |
| WO | 2015024956 A1 | 2/2015 |
| WO | 2015060954 A1 | 4/2015 |
| WO | 2015084921 A1 | 6/2015 |
| WO | 2015089023 A1 | 6/2015 |
| WO | 2015142778 A1 | 9/2015 |
| WO | 2015145724 A1 | 10/2015 |

OTHER PUBLICATIONS

Notice of Preliminary Amendment Mar. 28, 2024 for KR Application No. 10-2023-7001936.

Japanese Office Action dated May 20, 2024 for Japanese Application No. 2023-504276.

* cited by examiner

STEAM-ASSISTED SINGLE SUBSTRATE CLEANING PROCESS AND APPARATUS

CROSS-REFERENCE TO RELATED APPLICATIONS

This application is a divisional of U.S. patent application Ser. No. 17/141,622, filed Jan. 5, 2021, the entirety of which is herein incorporated by reference.

BACKGROUND

Field

Embodiments of the present disclosure generally relate to substrate processing, and more specifically to substrate processing tools and methods thereof.

Description of the Related Art

An integrated circuit is typically formed on a substrate by the sequential deposition of conductive, semiconductive or insulative layers on a silicon substrate. Fabrication includes numerous processes in which the surface of the substrate is cleaned at various stages before the formation of devices can be completed. One common method for cleaning the substrates is referred to as "spin cleaning." Although conventional spin cleaning processes remove process residue and contaminants, a substantial amount of cleaning solution and energy is used to achieve adequate cleaning and can also introduce corrosion during drying of the substrate.

Thus, there is a need for a method and apparatus capable of cleaning substrates at various stages of processing that is efficient and is substantially free of corrosion.

SUMMARY

In one embodiment, a method of cleaning a substrate is provided. The method includes rotating a substrate disposed on a substrate support and spraying a front side of the substrate using steam through a front side nozzle assembly. A back side of the substrate is sprayed using steam through a back side dispenser assembly. A heated chemical is dispensed over the front side of the substrate.

In another embodiment, an apparatus for cleaning a substrate is provided. The apparatus includes a chamber having a substrate support disposed therein. A point of use chemical heating and dispensing nozzle (e.g., POU nozzle) is disposed above the substrate support, and the POU nozzle includes a first conduit configured to be coupled to a fluid source and a second conduit configured to be coupled to a nitrogen source. A front side nozzle assembly is disposed above the substrate support, the front side nozzle assembly configured to be coupled to a first steam source and a first deionized water (DIW) source. A back side dispenser assembly is disposed below the substrate support, the back side dispenser assembly is configured to be coupled to a second steam source and a second DIW source.

In yet another embodiment, a method of processing a substrate is provided. The method includes polishing the substrate using a chemical mechanical planarization (CMP) process. After polishing the substrate, the substrate is disposed on a substrate support and is rotated thereon. A front side of the substrate is heated using steam through a front side nozzle assembly, and a back side of the substrate is heated using steam through a back side dispenser assembly. The method includes dispensing a heated chemical over the front side of the substrate. The front side and the back side of the substrate is rinsed using carbon dioxide dissolved DIW and steam. The substrate is dried by flowing a nitrogen gas over the front side of the substrate and a drying fluid.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, and the disclosure may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

The present disclosure relates to an apparatus and method for cleaning a substrate using a single pass cleaning process. Conventional single pass cleaning processes do not raise the substrate temperature high enough to enable effective and economical cleaning. Additionally, other conventional substrate cleaning includes a hot chemical bath for single or multiple substrates which can result in cross contamination, enables decomposition, and needs close monitoring to maintain chemical concentration and levels. The apparatus and method described herein heats a front side, a back side, or both sides of a substrate using steam, uses megasonic or steam jet agitation, and dispenses a point of use solvent or cleaning chemical over the surface of the substrate for effective cleaning. The substrate is rinsed and dried using a process that reduces contamination and corrosion. The apparatus and cleaning method described herein can be used for both front end of line (FEOL) and back end of line (BEOL) post chemical mechanical planarization of substrates. Polished BEOL substrates including metallic materials integrated in the circuits can be exposed to chemical solutions. Thus, to prevent corrosion during cleaning and rinsing substrates with exposed metallic materials in the integrated circuits on the substrate, the substrate is rinsed using carbon dioxide dissolved DIW and steam and is dried by flowing a nitrogen gas over the front side of the substrate and a drying fluid.

Figure 1:
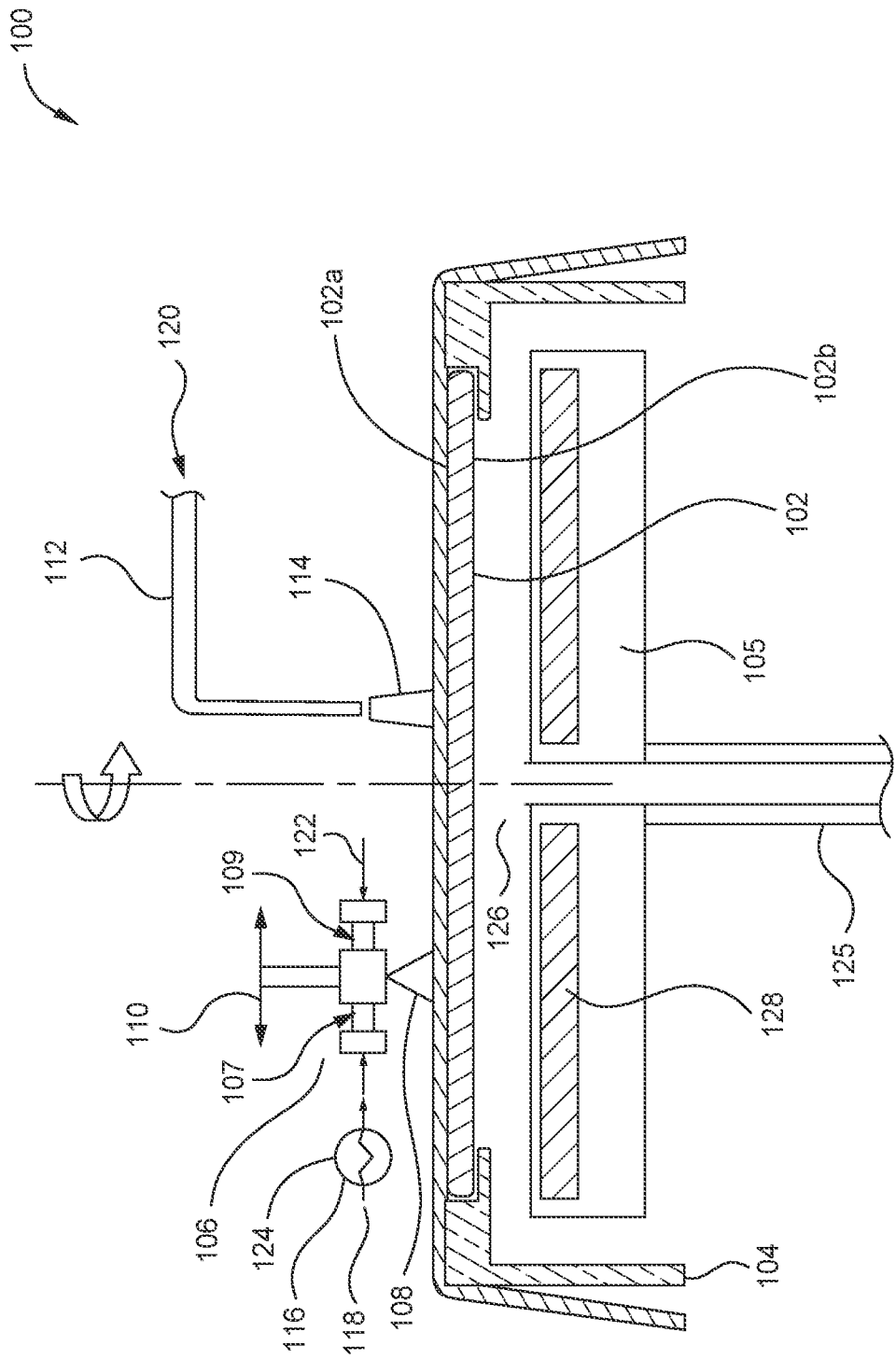
FIG. 1 is a cross-sectional schematic view of a substrate processing apparatus, including a substrate support, a back plate, and a dispense assembly according to an embodiment.

FIG. 1 depicts a cross-sectional schematic view of a substrate processing apparatus 100, including a substrate support 104, a back plate 105, and a cleaning dispense assembly. The substrate support 104 is capable of spinning as further described herein. The back plate 105 is vertically movable or is fixed.

A point of use chemical heating and dispensing nozzle (e.g., POU nozzle) 106 is disposed above a substrate 102 disposed on the substrate support 104. The POU nozzle 106 sprays atomized chemical droplets 108 to actively remove particles or contaminants from the substrate 102 without damaging surface features of the substrate 102. The POU nozzle 106 is moved along a planar axis 110 above the substrate 102. In operation, the POU nozzle 106 sweeps between a center region and a first edge region of the substrate. In some embodiments, micro-droplets are sprayed in a substantially even distribution about the front side 102a of the substrate 102. The POU nozzle 106 includes a first conduit 107 which is coupled to a heat exchanger 116. The heat exchanger 116 is coupled to a steam source 124 and a fluid source 118. The fluid source 118 is de-ionized water (DIW) and/or a cleaning chemical source. The fluid from the fluid source 118 is heated by the steam from the steam source 124 to form a heated fluid (e.g., heated chemical). A second conduit 109 is coupled to the POU nozzle 106 and a nitrogen gas source 122. In operation, the nitrogen gas atomizes the heated fluid and is sprayed on the front side 102a of the substrate 102 (e.g., atomized chemical droplets 108). In some embodiments, the cleaning chemical from the cleaning source is DIW, ammonium hydroxide, hydrogen peroxide, hydrofluoric acid, hydrochloric acid, sulfuric acid, or combination(s) thereof. The POU nozzle 106 is a low volume dispenser, such as an atomizer, which dispenses about 90 mL/min, such as about 20 mL to about 30 mL of cleaning chemical. The POU nozzle 106 provides good surface coverage of the substrate to clean the substrate using low amounts of chemicals. The POU nozzle is movable between a center of the back plate and an outer perimeter of the back plate.

A front side nozzle assembly 112 is disposed over the substrate 102 disposed on the substrate support 104 (e.g., off-center from the center of the substrate) and is capable of spraying de-ionized water (DIW) and/or steam over the front side 102a of the substrate 102 with a jet stream 114. In some embodiments, the front side nozzle assembly 112 releases steam over the front side 102a of the substrate 102 to heat the substrate 102. In some embodiments, the front side nozzle assembly 112 releases DIW to rinse the front side 102a of the substrate 102. In operation, the substrate 102 rotates at about 10 rpm to about 1000 rpm, such as about 500 rpm to about 900 rpm. The front side nozzle assembly 112 is capable of moving along a planar axis above the substrate in a direction between a center of the substrate and an edge of the substrate. The front side nozzle assembly 112 is capable of dispensing DIW at a rinse flow rate of about 800 ml/min to about 2000 ml/min.

A back side dispenser assembly 126 is disposed below the substrate 102 (e.g., centered below the substrate) and is capable of injecting de-ionized water (DIW) and/or steam over the back side 102b of the substrate 102. Fluid is injected through a support liquid channel 125 of the back side dispenser assembly 126 that runs through a central portion of the back plate 105. In some embodiments, the back side dispenser assembly 126 releases steam over the back side 102b of the substrate 102 to heat the substrate 102. In some embodiments, the back side dispenser assembly 126 releases DIW to rinse the back side 102b of the substrate 102. In operation, fluid from the back side dispenser assembly 126 is directed to a center of the back side 102b of the substrate 102 while the substrate 102 is spinning. In some embodiments, which can be combined with other embodiments described herein, fluid is dispensed from the back side dispenser assembly 126 through a single center orifice.

One or more piezoelectric transducers 128 is embedded in the back plate 105 to form a megasonic plate. The megasonic plate is capable of applying megasonic energy to the fluid provided by the back side dispenser assembly 126. In operation, the megasonic energy is coupled from the back side 102b to the front side 102a of the substrate 102 for agitation. It is believed that the megasonic plate provides agitation, which, in combination with the cleaning process described herein dissociates residues and contaminants from substrates 102. In some embodiments, which can be combined with other embodiments described herein, the megasonic energy is applied to fluid between the back plate 105 and back side 102b of the substrate 102 after exiting the back side dispenser assembly 126, as shown in FIG. 1.

Figure 2:
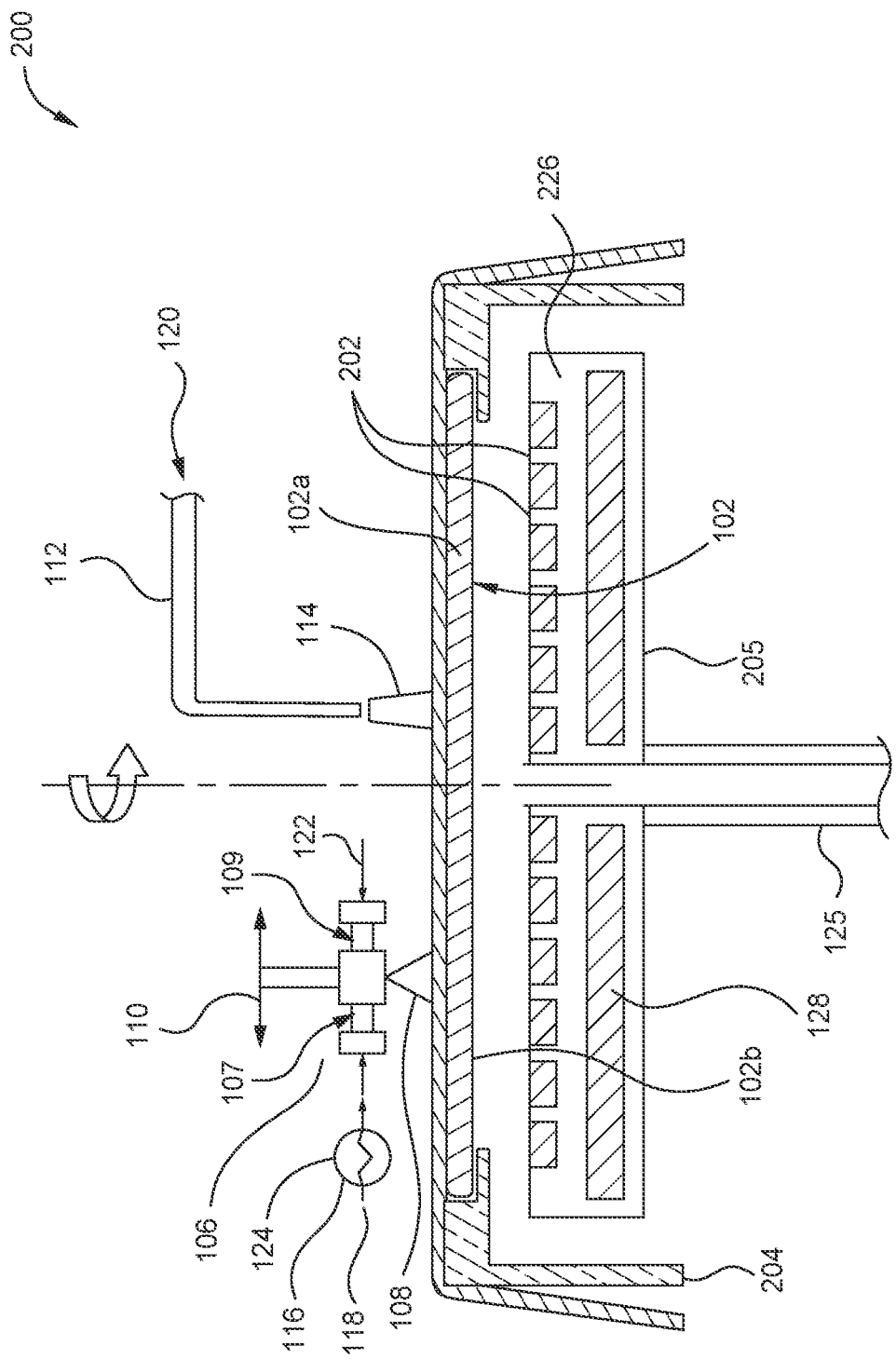
FIG. 2 is a cross-sectional schematic view of a substrate processing apparatus having a plurality of apertures on a back plate according to an embodiment.

FIG. 2 is a cross-sectional schematic view of a substrate processing apparatus 200 having a back side dispenser assembly 226 having a plurality of apertures 202 on a back plate 205 of the substrate processing apparatus. In operation, fluid is injected through channel 125 of the back side dispenser assembly 126 and is directed through a plurality of apertures 202 on the back plate 205 to the back side 102b of the substrate 102. One or more piezoelectric transducers 128 can also be used in combination with the plurality of apertures 202. In some embodiments, which can be combined with other embodiments described herein, megasonic energy is applied to fluid within the back side dispenser assembly 226 before exiting the back side dispenser assembly 226, as shown in FIG. 2. Alternatively, or additionally, megasonic energy is applied to fluid on the front side of the substrate.

Figure 3:
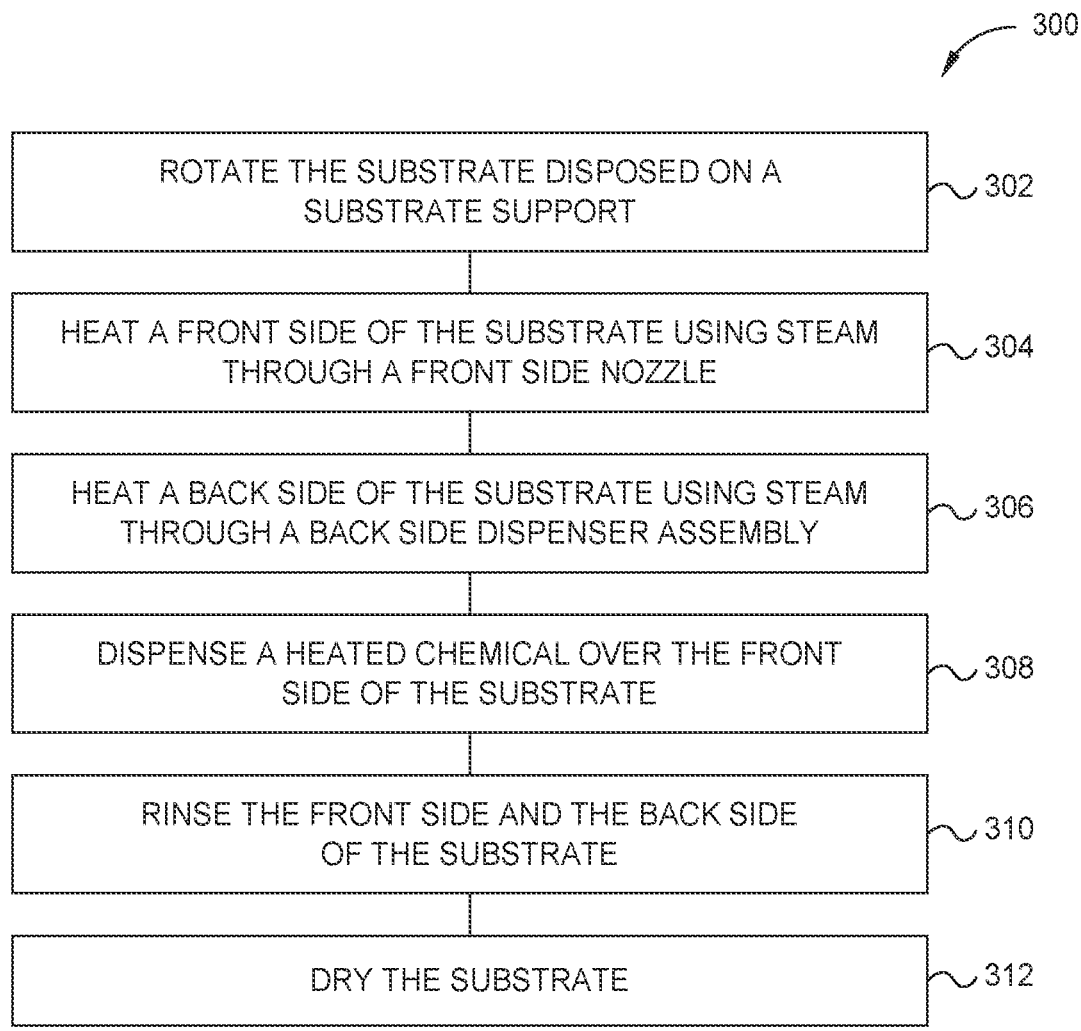
FIG. 3 is a process flow diagram of a method for processing a substrate according to an embodiment.

FIG. 3 is a process flow diagram of a method 300 for processing a substrate 102 according to an embodiment. In operation 302, a substrate 102 disposed on a substrate support 204 is rotated. The substrate 102 is positioned on a single substrate spin station as shown in FIG. 1 and FIG. 2. While the substrate is rotated, a front side 102a of the substrate 102 is heated using steam from a front side nozzle assembly 112 in operation 304. Alternatively, or additionally, a back side 102b of the substrate 102 is heated using steam from a back side dispenser assembly 126 in operation 306. In some embodiments, operation 304 occurs prior to operation 306, operations 304 and 306 occur simultaneously relative to one another, and/or operation 306 occurs prior to operation 304. The substrate 102 is heated to a predetermined temperature range, such as about 90° C. to about 140° C. In some embodiments, a total time from positioning the substrate in operation 302 to heating the substrate 102 to the predetermined temperature range is less than 10 seconds, such as about 4 seconds to about 6 seconds.

The back side dispenser assembly 126 and the front side nozzle assembly 112 releases steam to maintain the temperature of the substrate 102 within a predetermined range during processing. The predetermined range is determined based on a temperature at which a cleaning chemical reaction occurs based on the chemicals selected for cleaning the substrate. A cleaning chemical or chemical mixture is selected from DIW, ammonium hydroxide, hydrogen peroxide, hydrofluoric acid, sulfuric acid, or combination(s) thereof. In some embodiments, the cleaning mixture is a mixture of sulfuric acid and hydrogen peroxides. In some embodiments, the cleaning mixture is a mixture of ammonium hydroxide and hydrogen peroxide. In some embodiments, the cleaning mixture is a mixture of hydrochloric acid and hydrogen peroxide. In some embodiments, point of use chemical heating heats up chemicals being dispensed onto the substrate and minimizes decomposition of the cleaning chemicals. In conventional processes, such as in conventional batch or tank cleaning processes, cleaning chemicals are maintained at elevated temperatures which can decompose the cleaning chemicals. It has been discovered that using point of use chemical heating, less cleaning is lost to decomposition. Preheating the substrate before introducing the cleaning chemicals reduces temperature drop of the cleaning chemicals upon contact with the substrate, and reduces the amount of time needed for effective cleaning. The use of steam instead of hot DIW to heat the substrate, reduces the amount of DIW used and reduces the amount of time used to heat the substrate. Additionally, the use of steam instead of hot DIW further enables heating and agitation during the chemical cleaning process with minimal chemical dilution.

In operation 308, a heated cleaning chemical is disposed over the substrate 102 through a POU nozzle 106. The cleaning chemical is premixed and supplied from a cleaning chemical source 118 and heated using steam in the POU nozzle 106 prior to dispensing the heated cleaning chemical over the substrate 102. Preheating the chemicals in the POU nozzle before introducing the cleaning chemicals reduces decomposition of the cleaning chemicals upon contact with the substrate, and reduces the amount of chemicals used for effective cleaning. In some embodiments, nitrogen gas is injected in the POU nozzle 106 from a nitrogen gas source 122 and atomizes the heated cleaning chemical and/or DIW. In some embodiments, the nitrogen gas source is not used during operation 308. In some embodiments, about 60 mL/min to about 150 mL/m in, such as about 90 mL/min of chemicals is dispensed to cover the front side 102a surface of the substrate 102. The chemicals are disposed while the POU nozzle 106 is stationary, or the POU nozzle 106 moves along the planar axis 110 while dispensing. Steam from one or more of the front side nozzle assembly 112 and the back side dispenser assembly 126 is continuously supplied to the substrate during operation 308 to maintain a temperature for continued chemical reaction of the cleaning chemicals.

Acoustic cavitation, such as from megasonic energy, is applied from the back plate 105 and/or an acoustic source generator is coupled to one or more nozzles to provide agitation to the cleaning chemicals and steam for residue and particle removal. Acoustic cavitation includes ultrasonically or megasonically energizing the fluid to dislodge residue and debris. Acoustically energizing fluid uses a piezoelectric transducer (PZT) operating in a frequency range from a lower ultrasonic range (e.g., about 20 KHz) to an upper megasonic range (e.g., about 2 MHz). Other frequency ranges can be used. The shape of a suitable acoustic energy source generator (e.g., a PZT) is rectangular. It has been discovered that heating the substrate before introducing the cleaning chemistry enables the use of low volume cleaning chemicals and enables effective cleaning because the chemicals are introduced into a temperature environment that is already conducive for chemical reaction.

In operation 310, the front side 102a and the back side 102b of the substrate 102 is rinsed using heated DIW supplied from the front side nozzle assembly 112 and the back side dispenser assembly 126. In some embodiments, the front side nozzle assembly 112 and the back side dispenser assembly 126 each include multiple nozzles capable of dispensing steam and DIW simultaneously. During rinsing, steam and DIW are dispensed simultaneously through the front side nozzle assembly 112 and the back side dispenser assembly 126. Rinsing the substrate rinses away any dislodged residue and debris. The substrate continues to rotate during all operations described herein.

Operations 302 to 310 are used at, and/or between each stage of processing the substrate 102, such as front-end-of-line (FEOL) cleaning. For back-end-of-line (BEOL) processing, nitrogen is used to atomize steam-heated DIW in operation 310. In particular, BEOL processing occurs after polishing the substrate in CMP processing. The steam heated DIW used in the back side and front side nozzles described herein produces a reduced DIW surface tension which is efficiently atomized using less nitrogen gas. The energetic jet spray is capable of dislodging particles on the substrate surfaces 102a, 102b. In some embodiments, operations 302 to 310 are completed in less than 120 seconds, such as less than 90 seconds, such as less than 60 seconds.

In operation 312, the substrate 102 is dried. In some embodiments, the substrate is dried in less than 30 seconds. Drying the substrate 102 includes drying using a Rotagoni process. As used herein, a "Rotagoni Process" includes pulling fluids away from the surfaces of the substrate 102 using a surface tension gradient formed at the mixing front between a low surface tension fluid, such as IPA, and a high surface tension water. The surface tension can be reduced using isopropyl alcohol (IPA) spray or vapor, or any suitable spray or vapor that reduces surface tension of water that is dissolved therein. In some embodiments, the IPA is heated up to further reduce the surface tension of the IPA prior to applying to the substrate. In some embodiments, IPA is mixed with nitrogen to provide an IPA vapor and $N_2$ mixture to be dispensed over the substrate. Additionally, the Rotagoni Process and steam process used herein, quickly vaporizes the thin IPA film, that has replaced water film over the substrate using a low rotation rate of about 300 rpm to about 500 rpm, and thus dries the cleaned substrate.

The process prevents particle or residue from remaining on the substrate in some conventional processes directed to spin-drying by water film vaporization. For steam assisted wet cleaning of BEOL post-CMP substrates, such as post copper CMP cleaning, cleaning efficiency in removing particles and organic residues is often balanced with preventing potential metal corrosion. To prevent metal corrosion, exposure of clean metal surfaces to oxygen present in the rinsing water and air flow should be limited, particularly while the substrate temperatures are high. The Rotagoni Process includes providing an $N_2$ blanket over the substrate while the substrate is at an elevated temperature which prevents moisture from recondensing on the substrate surface, which displaces oxygen in the environment and reduces the relative humidity around the substrate surface. Furthermore, DIW can be degassed and regassed with $CO_2$ for post cleaning rinses, such as in operation 310 described herein. Corrosion is thus reduced without compromising cleaning efficiency. In some embodiments, the elevated substrate temperature during the Rotagoni Process is about 25° C. to about 40° C., such as about 30° C.

Thus, the present disclosure relates to a substrate cleaning method and apparatus configured to heat the substrate (e.g., using steam) to a predetermined temperature suitable for chemical reactions used to clean the substrate. The steam is provided on both the back and front side of the substrate for rapid heating. A heated chemical is dispensed in low quantities to the heated substrate to efficiently clean the substrate without using high volumes of cleaning chemicals. The process includes rinsing the substrate using steam and DIW on the front and back side of the substrate. The substrate is dried using a Rotagoni drying process to prevent corrosion, particles and residue.

What is claimed is:
1. A method of cleaning a substrate comprising:
   rotating a substrate disposed on a substrate support;
   spraying a front side of the substrate using steam through a front side nozzle assembly;

spraying a back side of the substrate using steam through a back side dispenser assembly; and dispensing a heated chemical over the front side of the substrate comprising mixing the heated chemical and a nitrogen gas in a chemical heating and dispensing nozzle (POU nozzle).

2. The method of claim 1, wherein spraying the front side of the substrate comprises applying a top spray nozzle above the substrate support.

3. The method of claim 1, wherein the POU nozzle is movable between a center of the substrate and an outer perimeter of the substrate.

4. The method of claim 3, wherein the POU nozzle comprises:

a first conduit coupled to a heat exchanger, wherein the heat exchanger is coupled to a steam source and a cleaning chemical source, wherein the heat exchanger releases the heated chemical into the first conduit of the POU nozzle; and a second conduit coupled to a nitrogen gas source.

5. The method of claim 1, wherein spraying the back side of the substrate comprises releasing steam through a center opening of a back plate disposed below the substrate.

6. The method of claim 1, further comprising:

rinsing the front side of the substrate using deionized water (DIW) through the front side nozzle assembly; and rinsing the back side of the substrate using DIW through the back side dispenser assembly.

7. The method of claim 6, wherein rinsing the back side and the front side of the substrate comprises spraying the back side and the front side with steam and DIW.

8. The method of claim 1, wherein spraying the front side and the back side of the substrate comprises heating the substrate to a temperature of about 90° C. and about 140° C.

9. The method of claim 1, wherein spraying the back side of the substrate comprises releasing steam through a plurality of perforations of a back plate.

10. The method of claim 1, further comprising applying megasonic energy to the substrate, wherein one or more vibrating transducer elements are disposed within a back plate.

11. The method of claim 1, wherein dispensing the heated chemical comprises dispensing about 20 mL to about 50 mL of chemicals to cover the front side of the substrate.

12. The method of claim 1, further comprising drying the substrate by dispensing isopropyl alcohol (IPA) and DIW at a substrate temperature of about 25° C. to about 40° C.

13. The method of claim 1, further comprising:

applying a nitrogen blanket over the front side of the substrate; and rinsing the front side of the substrate with carbon dioxide dissolved DIW.

14. A method of cleaning a substrate comprising:

rotating a substrate disposed on a substrate support;

spraying a front side of the substrate from above the substrate using steam through a front side nozzle assembly;

spraying a back side of the substrate using steam through a back side dispenser assembly; and dispensing a heated chemical over the front side of the substrate using a point of use (POU) nozzle disposed above the substrate support, the POU nozzle comprising a first conduit coupled to a fluid source and a second conduit coupled to a nitrogen source.

15. The method of claim 14, wherein spraying the back side of the substrate comprises releasing steam through a plurality of perforations of a back plate.

16. The method of claim 14, further comprising applying megasonic energy to the substrate, wherein one or more vibrating transducer elements are disposed within a back plate.

17. The method of claim 14, wherein the substrate support is disposed within a chamber, the chamber comprising a front side nozzle assembly disposed above the substrate support, the front side nozzle assembly configured to be coupled to a first steam source and a first deionized water (DIW) source.

18. The method of claim 14, wherein the substrate support is disposed within a chamber, the chamber comprising a back side dispenser assembly disposed below the substrate support, the back side dispenser assembly configured to be coupled to a second steam source and a second DIW source.

19. A method of cleaning a substrate comprising:

rotating a substrate disposed on a substrate support disposed within a chamber, the chamber comprising:

a point of use (POU) nozzle disposed above the substrate support, the POU nozzle comprising a first conduit configured to be coupled to a fluid source and a second conduit configured to be coupled to a nitrogen source;

a front side nozzle assembly disposed above the substrate support, the front side nozzle assembly configured to be coupled to a first steam source and a first deionized water (DIW) source; and a back side dispenser assembly disposed below the substrate support, the back side dispenser assembly configured to be coupled to a second steam source and a second DIW source;

spraying a front side of the substrate using steam through the front side nozzle assembly;

spraying the back side of the substrate using steam through the back side dispenser assembly; and dispensing a heated chemical over the front side of the substrate.

* * * * *